United States Patent [19]

Miner

[11] Patent Number: 5,273,798
[45] Date of Patent: Dec. 28, 1993

[54] HEAT AND SOLVENT RESISTANT PRESSURE-SENSITIVE LABEL

[75] Inventor: Amos J. Miner, Ballwin, Mo.

[73] Assignee: Watson Label Products, Corp., St. Louis, Mo.

[21] Appl. No.: 739,187

[22] Filed: Aug. 1, 1991

[51] Int. Cl.$^5$ ............................................. A61F 13/02
[52] U.S. Cl. ........................................ 428/40; 40/299; 40/316; 40/630; 283/81; 428/195; 428/220; 428/349; 428/355; 428/473.5; 428/901
[58] Field of Search ................. 428/40, 195, 220, 349, 428/355, 473.5, 901; 40/316, 299, 630; 283/81

[56] References Cited

U.S. PATENT DOCUMENTS

| | | | |
|---|---|---|---|
| 3,932,689 | 1/1976 | Watanabe | 428/473.5 |
| 4,098,935 | 7/1978 | Knudsen | 428/195 |
| 4,313,986 | 2/1982 | Magnotta | 428/40 |
| 4,584,238 | 4/1986 | Gen et al. | 428/349 |
| 4,772,512 | 9/1988 | Nagafuchi | 428/40 |
| 4,865,913 | 9/1989 | Takeuchi | 428/195 |
| 4,915,994 | 4/1990 | Begelfer et al. | 428/40 |
| 4,980,229 | 12/1990 | Park | 428/40 |
| 5,073,422 | 12/1991 | Konno | 428/40 |

FOREIGN PATENT DOCUMENTS 09668 1/1984 Japan.

*Primary Examiner*—Ellis P. Robinson
*Assistant Examiner*—Nasser Ahmad
*Attorney, Agent, or Firm*—Senniger, Powers, Leavitt & Roedel

[57] ABSTRACT

Thermally stable, solvent resistant labels comprising a face stock made of a high temperature resistant polymeric film having a print-receptive coating on its top surface, a curable, pressure-sensitive elastomeric adhesive containing at least one polymer having an acrylonitrile unit in the polymer chain and at least one phenolic resin applied to the bottom surface of the face stock, and a silicone release medium coated carrier liner releasably bonded to the elastomeric adhesive. When applied to a substrate, the labels adhere to the substrate, have minimum flow characteristics, maintain printed matter legibility and optical scannability after being heated to a temperature of less than about 600° F. and immersion in chemical baths of halogenated organic solvent solutions for periods as long as 10 minutes. Printed matter may be impressed upon the print-receptive coating of the label. Methods of producing and curing thermally stable, solvent resistant labels are also disclosed.

19 Claims, 3 Drawing Sheets

HEAT AND SOLVENT RESISTANT PRESSURE-SENSITIVE LABEL

BACKGROUND OF THE INVENTION

This invention relates to thermally stable labels, and more particularly, to labels especially suitable for use under conditions of high temperature and harsh chemical environments encountered in printed circuit board manufacturing processes.

Approximately seven hundred million circuit boards are currently being produced annually in North America. The market for this commodity has been growing at a rate of 7 to 10% each year. In particular, a technique for manufacturing printed circuit boards recently introduced into the United States, known as surface mount processing, has seen a dramatic upsurge during the past several years. According to industry sources, the number of printed circuit boards made using the surface mount process has more than doubled since 1987, and seems certain to continue to climb rapidly.

Surface mount processing of printed circuit boards is advantageous because of its emphasis on efficiency of manufacturing and automation. To enable circuit board manufacturers to track each board through the course of the automated manufacturing process, bar code labels are applied to the green or "raw" boards at the beginning of the manufacturing process. The manufacturer is able to maintain quality control by scanning a board's unique bar code and matching the board to the specifications assigned to that particular model, thereby ensuring that the specifications have been met. However, the surface mount process involves conditions unsuitable for conventional labels. The circuit boards are subjected to baking cycles at temperatures of 450° F. and above, as well as immersion in and exposure to high pressure sprays of a variety of strong solvents. Conventional labels constructed of face stocks made from paper, polyester or polyvinyl chloride have been found to be severely limited in their ability to retain label integrity under these environmental constraints. Label curling, shrinkage, lifting, loss of scannability and related problems were frequently encountered obstacles.

Labels utilizing high temperature resistant polymer films as face stock, e.g., films which will withstand temperatures of at least 500° F. indefinitely such as polyimides and polysulfones, have been commercially available since approximately 1983. However, the development of a label adhesive capable of adhering to such high temperature resistant polymers as well as to the surfaces of printed circuit boards under these conditions, without serious impairment of label integrity, has remained problematic.

Labels utilizing high temperature resistant polymer face stock in combination with acrylic adhesives made by 3M Company of St. Paul, Minn. have met with some measure of success in surviving the conditions present in the manufacture of printed circuit boards. Such labels are currently the standard of the industry for circuit board applications. However, at the higher ranges of temperatures encountered in printed circuit board processing, even labels utilizing high temperature resistant acrylic adhesives in combination with high temperature resistant polymer face stock have shown serious limitations. During extended exposure to temperatures at or above 400° F. during baking cycles, as well as exposure to the harsher chemical solvents, these labels have been known to fail. Frequently encountered problems include the tendency of such labels to "float" around on, or even off, the boards under these conditions. Additionally, significant outgassing of the label adhesive may occur, resulting in loss of adhesion to the board, and/or buckling of the facestock which in turn causes loss of scannability of the label. In sum, loss of label integrity continues to be a serious problem despite the use of the improved label materials discussed above.

Further label improvement has been difficult to obtain because of the combination of features required by the demanding nature of circuit board tracking. Ideally, the label should be pressure-sensitive so that it may be applied to the board with light pressure, but have sufficiently low initial tack that it may be easily transferred and repositioned prior to circuit board processing. The label must, however, be capable of interfacing intimately with the printed circuit board to adhere even under the aforementioned conditions of high heat and exposure to solvents. Moreover, since many substances exhibit superior adhesive qualities only with certain classes of materials, the label adhesive and face stock used must be compatible.

Thus, the development of a label capable of withstanding even the most demanding requirements of printed circuit board processing is highly desirable. Moreover, the discovery of such a label has been the object of considerable interest in the industry.

SUMMARY OF THE INVENTION

Among the several objects of the invention, therefore, may be noted the provision of a label which adheres tenaciously to printed circuit boards and maintains its integrity despite exposure to high temperatures; the provision of such a label which is resistant to a variety of aliphatic and aromatic solvents frequently encountered in printed circuit board processing; the provision of such a label which exhibits minimal shrinkage, curling, or outgassing of label adhesive during exposure to conditions present in printed circuit board processing; the provision of such a label which is pressure-sensitive; and the provision of such a label with low initial tack to allow for transfer and repositioning of the label prior to heat processing. Further objects of the invention include the provision of a method for manufacture of the aforementioned labels, and a method to cure said labels to maximize their efficacy during printed circuit board processing.

Briefly, therefore, the present invention is directed to a novel, thermally stable and solvent resistant label. The label includes a face stock comprised of a high temperature resistant polymeric film, a print receptive coating on the top surface of the face stock, a curable, pressure-sensitive elastomeric adhesive on the bottom surface of the face stock, a silicone release medium on the elastomeric adhesive, and a carrier liner bonded to the silicone release medium. The elastomeric adhesive contains a phenolic resin and a polymer having an acrylonitrile repeating unit in the polymer chain. When the carrier liner and silicone release agent are removed from the elastomeric adhesive, the label adheres to the substrate and maintains printed matter legibility and optical scannability after being heated to temperature between about 400° F. and about 600° F. and immersion in chemical baths of halogenated organic solvent solutions for periods as long as 10 minutes. Optionally, the label may have printed matter on the print-receptive coating thereof.

The present invention is further directed to a novel method for producing a label of the type described above. The method includes the steps of providing a face stock comprised of a high temperature resistant polymeric film, applying a print-receptive coating to the top surface of the face stock, providing a courable, pressure-sensitive elastomeric adhesive containing at least one polymer having an acrylonitrile unit in the polymer chain and at least one phenolic resin, heating the elastomeric adhesive to warm it to about 100° F. to about 150° F., and applying the heated elastomeric adhesive to the bottom surface of the face stock, releasably bonding the elastomeric adhesive to a silicone release medium, and affixing a carrier liner to the silicone release medium, thereby forming a label material. The label material is subsequently aligned in a die cutter and cut into a pre-selected shape forming a label.

Additionally, the present invention is directed to a method for curing the aforesaid labels comprising the steps of removing the carrier liner from the label, positioning the label on a substrate, applying pressure on the label to affix it to the substrate, heating the label for at least about 5 seconds at about 200° to about 250° F. to soften and partially cure the elastomeric adhesive so that it gains more intimate contact with and forms a thermally stable bond with the substrate, and heating the partially cured label at about 300° to about 350° F. for at least about 2 minutes to completely cure the elastomeric adhesive of the label and thereby form a strong bond with the substrate resistant to temperatures up to at least 600° F. and resistant to halogenated organic solvents.

DESCRIPTION OF THE DRAWINGS

Corresponding reference characters indicate corresponding parts throughout the several views of the drawings.

DESCRIPTION OF THE PREFERRED EMBODIMENT

In accordance with the invention, a novel, curable, pressure-sensitive label resistant to the relatively high temperatures and strong solvents encountered in printed circuit board manufacture has been produced. The label adheres readily to printed circuit boards by merely applying light pressure but, prior to typical circuit board processing, may be repositioned on the board or transferred to another board. The label includes a curable, pressure-sensitive elastomeric adhesive which, upon heating, flows and thereby more intimately contacts the surface material of the printed circuit board. Upon further exposure to heat, such as that encountered in the infra-red baking cycles of surface mount processing, a strong, permanent bond is formed between the label and the circuit board's surface which is highly resistant to the further baking and solvent wash cycles experienced during the production of printed circuit boards.

Figure 1:
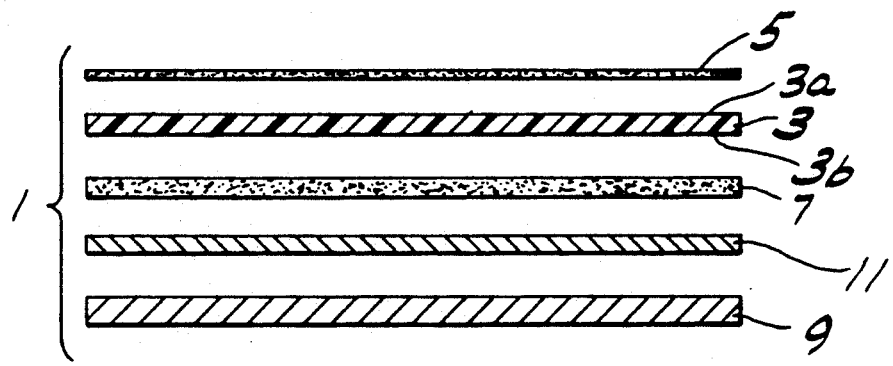
FIG. 1 is a cross-sectional view of the components of the label of the invention prior to assembly.
Figure 2:
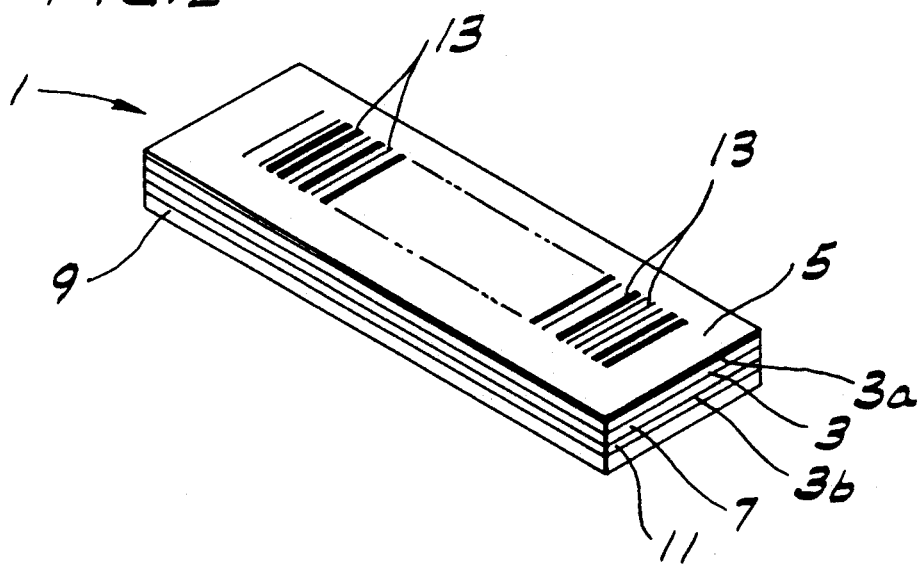
FIG. 2 is a perspective view of the assembled label of the invention, showing a typical bar code legend impressed upon the print-receptive coating.

Referring now to the drawings, and first, more particularly to FIGS. 1 and 2, a label constructed in accordance with this invention, in pre-assembled and assembled forms, is designated in its entirety by the reference numeral 1.

The label is constituted generally of face stock 3, a print-receptive coating 5, a curable, pressure-sensitive elastomeric adhesive 7, a carrier liner 9 and silicone release medium 11. Printed matter 13 may be impressed upon the print-receptive coating. The manner in which these components are combined together to form a label will be described below.

The face stock 3 is composed of a high temperature resistant polymeric film and has a top surface 3a and a bottom surface 3b. Preferably, the polymeric film is made of a material selected from the group of polymers having imide, ether imide, ether ether ketone or sulfone repeating units in the polymer chain. It has been found that each of the above-mentioned polymeric films stands up exceptionally well to the combination of elevated temperatures and exposure to strong solvents typical of surface mount circuit board processing. Examples of commercially available films which contain these high temperature resistant polymers include Stabar S100 TM made from Victrex ® polyethersulfone polymer and K200 TM composed of non-crystallized, nonoriented polyetheretherketone, available from ICI Films of Wilmington, Del., polyetherimide films such as Ultem ®, available from General Electric Company of Pittsfield, Mass., and polyimide films such as Upilex ® polyimide film produced by ICI of Wilmington, Del., and Kapton ® brand polyimide film available from DuPont Company of Wilmington, Del. Particularly preferred are the polyimide films, which are copolymers of a tetracarboxylic acid dianhydride and an organic diamine.

Applied to the upper surface 3a of the face stock 3 is a print receptive coating 5 adapted to receive printed matter 13 such as the broad and narrow bands which make up the machine-readable symbols of a bar code. Print receptive coatings are generally known to the art and will not be described in detail herein. These coatings usually include one or more solid particulates added to impart ink receptivity. A wide variety of specific compounds are used for this purpose, including silicates such as magnesium, calcium, hydrated aluminum and potassium aluminum silicate, and other compounds such as magnesium oxide, silicon dioxide and calcium carbonate. Print-receptive coatings may include other ingredients such as pigments to provide for opacity, and anti-oxidants. A particular example of a high-temperature polymeric film to which a print-receptive coating has been added is Tekra TM Kapton ®. This coated Kapton ®, which is used in the preferred embodiment of the invention, has demonstrated heat resistance of up to 1 hr. at 500° F., and has successfully survived immersion for 10 minutes in freon, acetone and 1,1,1-trichloroethane solvents, which are sometimes used in circuit board processing.

A long-standing problem for printed circuit board labels has been its adhesive component. Currently available adhesives tend to soften and flow excessively at temperatures of 400° F. or above causing the label to slide around on or even off the board. Additionally, substantial outgassing of the heated adhesive may cause label lifting and curling. Moreover, standard adhesives particularly when heated, do not stand up well to halogenated organic solvents such as Freon and trichloroethane, utilized to clean printed circuit boards during surface mount processing.

According to the invention, it has been discovered that a particular curable elastomeric adhesive is well-suited to the rigors of printed circuit board manufacturing processes. Significantly, it serves as a pressure-sensitive adhesive allowing the label to be removed and repositioned prior to curing, and upon curing, tenaciously adheres the label to the surface material of printed circuit boards.

The pressure-sensitive elastomeric adhesive contains at least one phenolic resin and at least one polymer having an acrylonitrile repeating unit in the polymer chain. Such compositions, commonly known as nitrile rubber-phenolic resin blends, have long been known to have utility as adhesives, but were not previously known to have the unique combination of qualities discussed above, which make them especially suited for labels applied to printed circuit boards.

The curable, pressure-sensitive elastomeric adhesive is prepared by blending nitrile rubber polymer with phenolic resin. Nitrile rubber is comprised primarily of a co-polymer of acrylonitrile and butadiene. Some portion of the acrylonitrile may be replaced by such related Compounds as methacrylonitrile and ethacrylonitrile, and similarly, portions of the butadiene may be replaced with other dienes such as isoprene, piperylene and 2,3-dimethylbutadiene. Nitrile rubber is prepared by an emulsion polymerization reaction well-known in the art, and frequently includes other additives such as sulfur or sulfur-releasing compounds, reaction accelerators and activating agents, pigments and plasticizers. Nitrile rubber polymer compositions vary widely but typically contain between about 15% to about 40% acrylonitrile and between about 85% and 60% butadiene. Preferably, the nitrile rubber contains between about 25% to 35% acrylonitrile, most preferably 30% acrylonitrile.

The phenolic resins blended with the nitrile rubber are thermosetting resins obtained from the condensation reaction of phenol or substituted phenols with simple aldehydes such as formaldehyde, acetaldehyde and furfural. The most common phenolic resin, and the preferred type for use in the label adhesive of the invention, is phenol-formaldehyde resin. In general, the phenolic resins improve the plasticity of nitrile rubber stock prior to curing, and by cross-linking with the nitrile rubber, help to stiffen the adhesive after curing. The ratio of phenolic resin and nitrile rubber blended may vary over a wide range, and the blend may be prepared, for example, using about 30 parts of reactive phenol-formaldehyde resin to about 100 parts of acrylonitrile-butadiene polymer (35% acrylonitrile).

Additional additives such as fillers, anti-oxidants such as phenyl-$\beta$-naphthylamine and triphenyl phosphite, and tackifiers such as dioctyl phthalate, dibutyl phthalate and tributoxyethylphosphate may be included in the nitrile rubber-phenolic resin elastomeric adhesive. Many additional compounds are known which serve various purposes for such elastomers and discussions of their use and preferred ranges are readily available in the literature.

A variety of nitrile rubber-phenolic resin elastomers are known. However, the elastomers suitable for use as the adhesive for the label of the invention are generally limited to those which are especially suited for use under the particular requirements of printed circuit board processing. Such elastomers are capable of adhering to a substrate after being heated to a temperature between about 400° F. and about 600° F., possess minimum flow characteristics after being heated so as to maintain printed matter legibility and optical scannability, and are resistant to chemical baths of halogenated organic solvent solutions for immersions as long as 10 minutes.

A particularly preferred curable, pressure-sensitive elastomeric adhesive is sold under the trademark, HS-102 TM by Coating Sciences, Inc. of Bloomfield, Conn. HS-102 TM contains an acrylonitrile butadiene rubber, a mixture of phenolic resins, and various antioxidants.

The silicone release medium 11 releasably adheres the carrier liner 9 to the pressure-sensitive elastomeric adhesive 7. Prior to application to a substrate, the carrier liner 9 is removed (with the release medium remaining thereon) to expose the elastomeric adhesive. A conventional paper or film carrier liner is suitable for this purpose. Preferably, a 60 lb. silicone release medium coated on densified Kraft TM release carrier liner or a 1.5 mil silicone release medium coated on polyester are used.

The label of the invention may be provided without any printed matter on the label for on-demand, in-house printing applications, thus permitting the label user to add print at a later date according to his particular requirements. Alternatively, the label is provided with printed matter 13 already impressed upon the print-receptive coating 5 of the label. The printed matter should provide contrast to the print-receptive coating (generally a dark color of print versus a white or light colored coating) and should be heat and solvent resistant. In the preferred embodiment of the invention, the printed matter is a black, carbon based, heat resistant ink. Iron oxide and phthalocyanine pigments are additional examples of suitable print materials.

Label thickness is generally standardized for printed circuit board applications due to the fact that the label is frequently used to set the caliper which adjusts the amount of flux that is applied to the board during silk screening. A label that is too thick allows too much flux to be applied, creating adhesion problems and making the flux more difficult to dry. Preferably, therefore, for printed circuit board applications, the face stock component of the label of the invention has a thickness of about 0.9 mils (2.29 mm) to about 2.2 mils (5.59 mm), the print-receptive coating has a thickness of about 0.8 mils (2.03 mm) to about 1.2 mils (3.05 mm), and the elastomeric adhesive, silicone release medium and liner have a combined thickness of about 0.8 mils (2.03 mm) to about 2.0 mils (5.08 mm). Most preferably, the face stock has a thickness of about 2.0 mils (5.08 mm), the print-receptive coating has a thickness of about 1.0 mils (2.54 mm), and the adhesive layer, silicone release medium and liner have a combined thickness of about 1.4 mils (3.56 mm).

Printed circuit board labels are generally of a smaller dimension than other labels because space on the surface of the board is at a premium. Typical label sizes for printed circuit board applications include 0.2" (5.08 mm)$\times$0.5" (12.7 mm), 0.25" (6.35 mm)$\times$0.40" (10.16 mm), 0.15" (3.81 mm)$\times$1.5" (38.1 mm), 0.135" (3.43 mm), and 0.25" (6.35 mm)$\times$2.0" (50.8 mm).

The invention also relates to a method of preparing the label described above. In preparing the label, the top surface 3a of the high temperature resistant polymeric film which serves as the label face stock 3 is coated with a print-receptive coating 5 by use of a roll coater or other conventional means. If the label 1 is to be preprinted, printed matter 13 is preferably impressed upon the print-receptive coating 5 prior to combination of the face stock with a label adhesive. Any of a number of imprinting techniques may be employed, including photographic imaging, dot matrix, impact, offset, thermal transfer and laser printing. In the preferred embodiment of the invention for preparation of bar code labels for printed circuit boards, a phototypeset image or impression, for example, bar code sequences, is created on photographic paper, such as Agfa ® produced by the Eastman-Kodak Co., Anitec Division, International Paper Co. or Agfa Compugraphic Div., Agfa Corporation. The image is developed and transferred to an offset plate which in turn impresses the image onto the top, coated surface 3a of the face stock 3.

The elastomeric adhesive 7 may be applied directly to the face stock 3. Alternatively, it may be applied to the silicone release medium on the carrier liner, heated with a heat gun or other heat source to a temperature of about 100° F. to about 150° F., and then applied to the bottom surface 3b of the face stock 3. To produce individual labels, the label material, usually in the form of a roll of consecutive bar code, or other legible sequences, is aligned in a die cutter and the die cutter cuts out labels in pre-selected shapes. Preferably, the alignment of the roll of label material is calibrated by use of a sensing device which "reads" the location of the "web" or roll of label material. The sensing device sends a signal as to the positioning of the label material to the die cutter's alignment mechanism in order to adjust the angle of entry of the label material into the die cutter to maintain proper alignment of the material to be cut both in the "cross-web" and "in the machine" directions.

To use the label, the protective liner and silicone release agent are peeled away thereby exposing the elastomeric adhesive. The exposed elastomeric adhesive is placed on the surface of a substrate such as a printed circuit board by the simple application of light pressure. Prior to curing, described below, the label has sufficiently low initial tack that the label may be transferred to another circuit board or repositioned on the original.

Upon application to a substrate, the elastomeric adhesive may be cured, i.e., cross-linked by baking the label at a temperature of about 300° to about 350° F., for at least about 2 minutes. Preferably, the elastomeric adhesive is cured by baking at a temperature of about 350° F. for about 3 to 5 minutes. Prior to curing, the label may be heated to a temperature of about 200° to about 250° F. for about 5 seconds to initially soften the elastomeric adhesive and allow it to flow and partially cure, thereby gaining more intimate contact with the surface of the substrate. Upon curing, the label is tenaciously bonded to the substrate and will withstand the solvent washes and elevated temperatures common to printed circuit board processing.

For purposes of printed circuit board processing, the curing of the label described above is particularly suited to be carried out as a part of the normal processing of the printed circuit boards by simply baking the label in the infra-red ovens commonly utilized in circuit board manufacturing systems. Thus, the label may be cured merely as an adjunct to normal circuit board processing procedures. This, in fact, is the preferred method of curing the label of the invention.

The following examples illustrate the invention.

EXAMPLE 1

A thermally stable, solvent-resistant label for application to printed circuit boards was produced using the following procedure. Bar code sequences coding for printed circuit board tracking procedures were phototypeset on International Paper Co.'s Anitec ™ photographic paper using an APS-5 Autologic phototypesetter from Datalogic. The images of the bar code sequences were developed by a PC1800 from Log-E Corp. Using carbon black ink, these images were impressed upon the top surface of Tekra ™ Kapton ® label face stock consisting of 2 mils of polyimide high temperature film coated on its top surface with 1 mil of a print-receptive coating via an A.B. Dick offset printing press. HS-102 ™ brand elastomer, a composite of a curable, pressure-sensitive elastomeric adhesive made from acrylonitrile-butadiene rubber, a mixture of phenolic resins and antioxidants, releasably bonded to a 60 lb. silicone release medium, the medium being coated on densified Kraft ® carrier liner, was applied to the bottom surface of the face stock. To apply the composite, thus creating the completed label material, the face stock and composite were laminated in a roll laminator which also serves to die cut the finished label material. To enhance the bonding of the composite to the face stock, a heat gun was used to warm the composite to a temperature of approximately 125° F. prior to its entry into the laminator. The warmed composite was applied to the face stock and the curable, pressure-sensitive elastomeric adhesive readily adhered to the bottom surface of the face stock. The now completed label material was die cut by the rotary tooling into 0.25" mm)×2.0" (50.8 mm) labels. A G & L Electronics Piclock electronic sensing device read the web guide marks imprinted on the label material and adjusted the angle of entry of the label material in both the "cross-web" and the "in the machine" directions, thus aligning the label cut to within +/−5/1000ths of an inch in both directions.

EXAMPLE 2

To test the curing properties of the elastomeric adhesive used in the label of the invention, and the adhesive utilized in prior art labels, HS-102 ™ elastomeric adhesive and 3M Co.'s #100 "Hi-Temperature" Acrylic Adhesive were applied as follows. HS-102 ™ elastomer was placed on one glass slide (sample 1), HS-102 ™ elastomer was placed on a second glass slide and a metal square, one inch in length, was placed on the surface of the elastomer (sample 2), and #100 acrylic adhesive was placed on a third glass slide (sample 3). The three slides were baked at 500° F. for 2 mins., removed from the oven and allowed to cool for 1 min. One inch long metal squares were dropped lightly on samples 1 and 3. Removal of the metal squares was then attempted for all three samples and the curing of the samples was checked. The metal square was easily removed from sample 1, evidencing that the adhesive had cured to a hard, "thermoset" film upon heating. The metal square was firmly affixed to sample 2, evidence that a strong bond had been formed upon heating. Sample 3 had bonded to the metal square dropped after cooling, demonstrating that the acrylic adhesive remained soft and tacky after heat treatment and had not cured appreciably

EXAMPLE 3

Figure 3A:
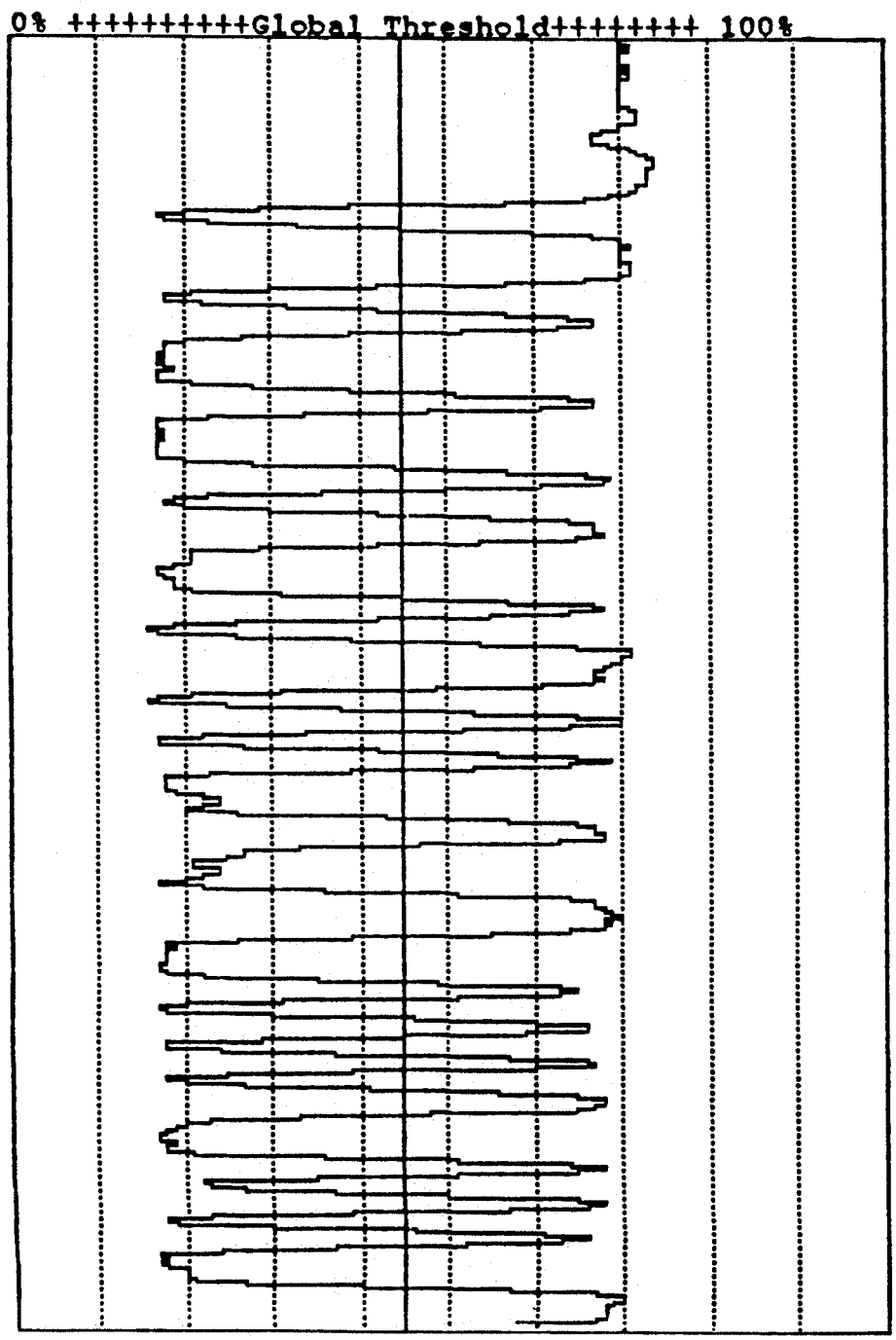
FIG. 3 is a computer readout and graph of a bar code scan produced by a verification scanner for a bar code label constructed according to the invention before heating (FIG. 3a) and after being heated for 10 min. at 500° F.
(FIG. 3b).
Figure 3B:
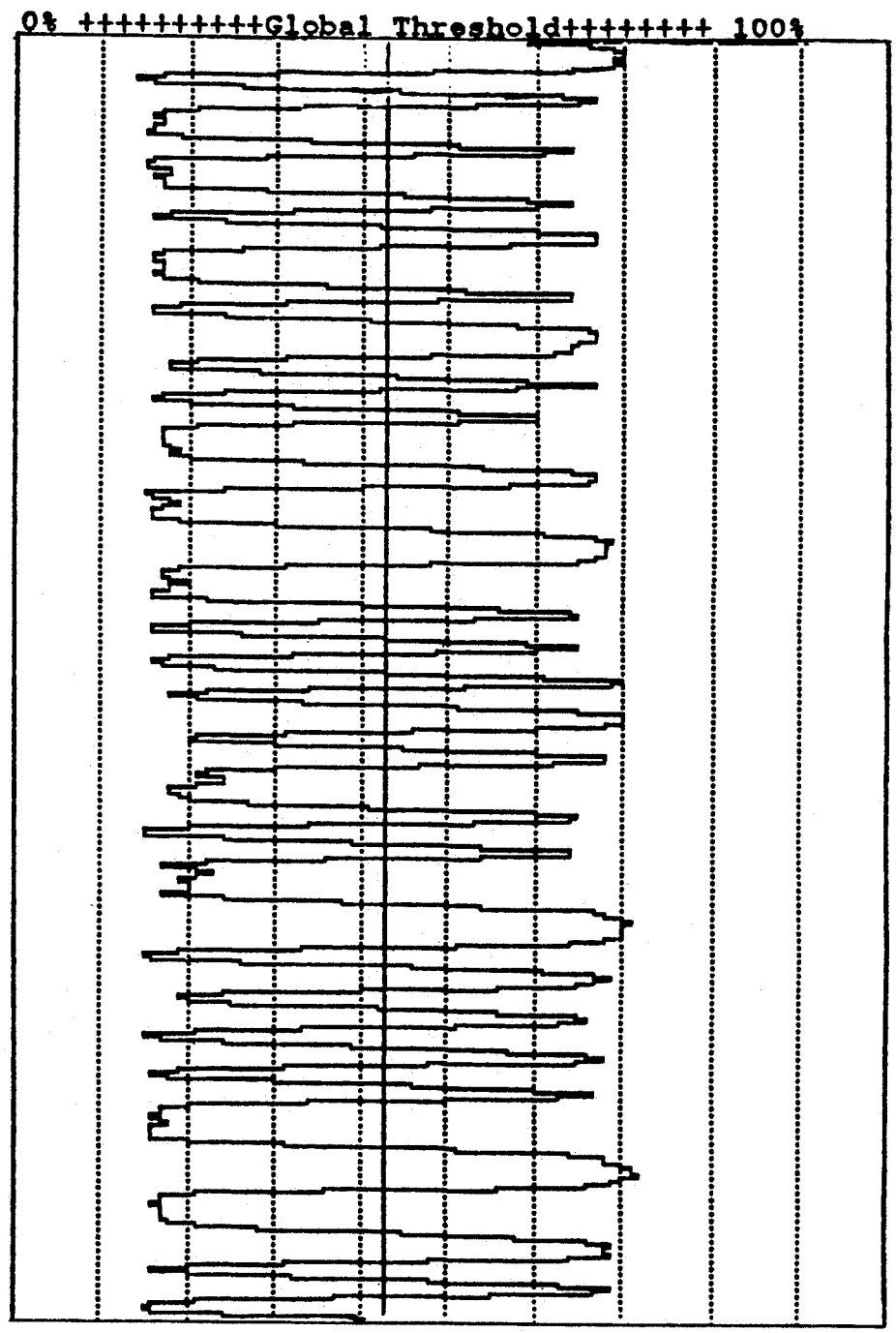

Two bar code labels were produced according to the procedure of Example 1. The label liner was peeled away and each bar code label was placed on a glass slide. One bar code label was then baked at 500° F. for 10 mins. Each bar code label was then tested for bar code scannability. An Inspector IV ™ bar code verification scanner manufactured by RJS Enterprises, Inc. of Monrovia, Calif., commonly used in the industry to confirm bar code scannability, was used to conduct a scan profile analysis of both the unheated and heat-treated labels. Both labels registered a "pass" (within industry specifications) scannability rating from the profile analysis. The computer readout and graph of the bar code scan produced by the Inspector IV ™ for each label are set forth in FIGS. 3(a) and (b). After baking, the heated label was immersed in a jar of Freon for 3 mins., removed, and heated again at 500° F. for an additional 10 mins. No blistering, cracking, outgassing of adhesive or ink smearing was observed.

EXAMPLE 4

A label was produced in accordance with the procedures outlined in Example 1. The carrier liner was peeled away from the label exposing the elastomer. The label was then applied with light pressure by hand to the surface of a "raw" printed circuit board made by HADCO. Because of limited space allocations for the board's surface components, the label was placed on the top of the board near an edge. The label was not properly positioned initially, so it was removed and then reapplied. The board, with label in place, was then baked in an infra-red "reflow" or surface mount oven for 5 secs. at 240° F. to partially cure the label adhesive, allowing the label to form an intimate, temperature resistant bond with the surface of the board. The partially cured label was then completely cured in the oven by heating it at 350° F. for 2 mins. The board was then passed into a silk screening chamber where the chamber drops down on the board and flux was silk screened onto the board's surface. Small board components were then dropped by a robotic system into their proper positions on the printed circuit board. An optical scanner inspected the board, checked the label and determined that the board was satisfactory and should not be rejected. The board then proceeded through a "case hardening" bake cycle to set the flux, helping the flux to hold the electronic components in the proper position. The board was baked in the infra-red oven at temperatures increasing from 70° F. to 500° F. for approximately 6 minutes. "Through hole" components were then placed on the board by hand. After placement of the through hole components, the board passed over a molten solder bath with the solder touching electrical connecting portions of the through hole components for several seconds. An acidic foaming chemical cleaner was then applied to the bottom of the board, with some cleaner bubbling over onto the top of the board. An "air knife", a jet of hot air at 800° F., was then used to blow unwanted particles off the board and prepare the board for immersion in hot solvent. The board was then immersed for 10 mins. in a Genosolv DFX ™ solvent solution, containing over 90% Freon, and a balance of methanol, isohexane, acetone and nitromethane which had been preheated to 104° F. The finished circuit board was then sprayed with the same solvent solution at high pressure (160 psi). The board's label was checked and found to have maintained its label integrity, showing no signs of curling, shrinkage, adhesive outgassing or other deformity.

In view of the above, it will be seen that the several objects of the invention are achieved and other advantageous results attained.

As various changes could be made in the above methods and products without departing from the scope of the invention, it is intended that all matter contained in the above description shall be interpreted as illustrative and not in a limiting sense.

What is claimed is:

1. A thermally stable, solvent resistant label comprising:
    a face stock comprised of a high temperature resistant polymeric film having top and bottom services, the top surface having a print-receptive coating thereon,
    a curable, pressure-sensitive elastomeric adhesive on the bottom surface of the face stock, the elastomeric adhesive containing an adhesion-providing component consisting of a blend of at least one phenolic resin and at least one rubber polymer having a nitrile-containing repeating unit in the polymer chain,
    a silicone release medium on the elastomeric adhesive, and
    a carrier liner bonded to the silicone release medium, wherein, the label is capable of maintaining printed matter legibility and optical scannability after being applied to a substrate and heated to a temperature between about 400° F. and 600° F. and immersion in chemical baths of halogenated organic solvent solutions for periods as long as 10 minutes.

2. A label as set forth in claim 1 wherein the high temperature resistant polymeric film contains a polymer having imide, ether imide, ether ether ketone or sulfone repeating units in the polymer chain.

3. A label as set forth in claim 1 wherein the elastomeric adhesive further comprises a tackifying agent.

4. A label as set forth in claim 1 wherein the elastomeric adhesive further comprises at least one antioxidant.

5. A label as set forth in claim 1 wherein the face stock has a thickness of about 2.0 mils (5.08 mm), the print-receptive coating has a thickness of about 1.0 mil (2.54 mm), the elastomeric adhesive has a thickness of about 1.4 mils (3.56 mm), and the silicone release medium and liner have a combined thickness of about 3.0 to 3.5 mils.

6. A thermally stable, solvent resistant label comprising:
    a face stock comprised of a high temperature resistant polymeric film having top and bottom surfaces, the top surface having a print-receptive coating thereon,
    a curable, pressure-sensitive elastomeric adhesive on the bottom surface of the face stock, the elastomeric adhesive consisting a phenolic resin and a rubber polymer having an acrylonitrile repeating unit in the polymer chain,
    a silicone release medium on the elastomeric adhesive, and
    a carrier liner on the silicone release medium, wherein, the label is capable of maintaining printed matter legibility and optical scannability after being applied to a substrate and heated to a temperature between about 400° F. and 600° F. and immersion in chemical baths of halogenated organic solvent solutions for periods as long as 10 minutes.

7. A label as set forth in claim 6 wherein the high temperature resistant polymeric film comprises a polymer having imide, ether imide, ether ether ketone or sulfone repeating units in the polymer chain.

8. The label of claim 6 wherein the elastomeric adhesive further comprises a tackifying agent.

9. The label of claim 6 wherein the elastomeric adhesive further comprises at least one antioxidant.

10. The label of claim 6 wherein the face stock component has a thickness of about 0.9 mils (2.29 mm) to about 2.2 mils (5.59 mm), the print-receptive coating has a thickness of about 0.8 mils (2.03 mm) to about 1.2 mils (3.05 mm), and the elastomeric adhesive, silicone release medium and liner have a combined thickness of about 0.8 mils (2.03 mm) to about 2.0 mils (5.08 mm).

11. The label of claim 6 wherein the face stock component has a thickness of about 2.0 mils (5.08 mm), the print-receptive coating has a thickness of about 1.0 mils (2.54 mm), and the elastomeric adhesive, silicone release medium and liner have a combined thickness of about 1.4 mils (3.56 mm).

12. A method of curing the label of claim 1 comprising:
    applying pressure to the label to affix it to a substrate,
    heating the label to a temperature of about 200° F. to about 250° F. for at least about 5 seconds to soften the elastomeric adhesive and cause it to flow and partially cure, thereby gaining more intimate contact with the substrate, and
    baking the partially cured label at about 300° F. to about 350° F. for at least about 2 minutes to completely cure the elastomeric adhesive and thereby form a tight bond with the substrate resistant to temperatures up to at least about 600° F. and resistant to halogenated organic solvent solutions.

13. A method as set forth in claim 12 wherein the label is baked in an infra-red oven.

14. A method as set forth in claim 12 wherein the label is heated to about 250° F. for at least about 5 seconds and baked at about 350° F. for at least about 2 minutes to completely cure the elastomeric adhesive.

15. A thermally stable, solvent resistant label comprising:
    a face stock having a thickness of about 0.9 mils (2.99 mm) to about 2.2 mils (5.59 mm) comprised of a high temperature resistant polymeric film having top and bottom surfaces, the top surface having a print-receptive coating thereon, the print-receptive coating having a thickness of about 0.8 mils (2.03 mm) to about 1.2 mils (3.05 mm),
    a curable, pressure-sensitive elastomeric adhesive on the bottom surface of the face stock, the elastomeric adhesive consisting a phenolic resin and a rubber polymer having an acrylonitrile repeating unit in the polymer chain,
    a silicone release medium on the elastomeric adhesive, and
    a carrier liner bonded to the silicone release medium, the elastomeric adhesive, silicone release medium and liner having a combined thickness of about 0.8 mils (2.03 mm) to about 2.0 mils (5.08 mm), wherein the label is capable of maintaining printed matter legibility and optical scannability after being applied to a substrate and heated to a temperature between about 400° F. and 600° F. and immersion in chemical baths of halogenated organic solvent solutions for periods as long as 10 minutes.

16. A label as set forth in claim 15 wherein the high temperature resistant polymeric film contains a polymer having imide, ether imide, ether ether ketone or sulfone repeating units in the polymer chain.

17. A label as set forth in claim 16 wherein the print-receptive coating bears printed matter thereon.

18. A label as set forth in claim 1 wherein the print-receptive coating bears printed matter thereon.

19. A label as set forth in claim 6 wherein the print-receptive coating bears printed matter thereon.

* * * * *